(12) United States Patent
Huebner et al.

(10) Patent No.: US 11,946,950 B2
(45) Date of Patent: Apr. 2, 2024

(54) ELECTRO-OPTICAL CIRCUIT BOARD FOR CONTACTING PHOTONIC INTEGRATED CIRCUITS

(71) Applicant: Carl Zeiss SMT GmbH, Oberkochen (DE)

(72) Inventors: Philipp Huebner, Hamburg (DE); Stefan Richter, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 716 days.

(21) Appl. No.: 17/062,954

(22) Filed: Oct. 5, 2020

(65) Prior Publication Data

US 2021/0033643 A1 Feb. 4, 2021

Related U.S. Application Data

(63) Continuation of application No. PCT/EP2019/058777, filed on Apr. 8, 2019.

(30) Foreign Application Priority Data

Apr. 9, 2018 (DE) .......................... 102018108283.5

(51) Int. Cl.
| | | |
|---|---|---|
| *G01R 1/07* | (2006.01) | |
| *G01R 1/073* | (2006.01) | |
| *G01R 31/311* | (2006.01) | |
| *G02B 6/26* | (2006.01) | |
| *G02B 26/08* | (2006.01) | |

(52) U.S. Cl.
CPC .............. *G01R 1/071* (2013.01); *G01R 1/073* (2013.01); *G01R 31/311* (2013.01); *G02B 6/26* (2013.01); *G02B 26/0816* (2013.01)

(58) Field of Classification Search
CPC ...... G01R 1/071; G01R 1/073; G01R 31/311; G02B 6/26; G02B 26/0816
See application file for complete search history.

(56) References Cited

U.S. PATENT DOCUMENTS

| | | | |
|---|---|---|---|
| 5,631,571 | A | 5/1997 | Spaziani |
| 6,307,392 | B1 | 10/2001 | Soejima |
| 7,250,317 | B2 | 7/2007 | Heideman |
| 2004/0017215 | A1 | 1/2004 | Mule |
| 2004/0037512 | A1 | 2/2004 | Cho |
| 2005/0194990 | A1* | 9/2005 | Gothoskar ............... G02B 6/34 324/754.23 |

(Continued)

FOREIGN PATENT DOCUMENTS

| | | |
|---|---|---|
| CN | 101203783 A | 6/2008 |
| CN | 101421823 | 4/2009 |

(Continued)

OTHER PUBLICATIONS

Chinese Office Action, with translation thereof, for corresponding CN Appl No. 2019800225561, dated Apr. 6, 2023.

(Continued)

*Primary Examiner* — Lee E Rodak
(74) *Attorney, Agent, or Firm* — Fish & Richardson P.C.

(57) ABSTRACT

An electro-optical circuit board can provide probe card functionality. The electro-optical circuit board includes at least one electrical conductor track and at least one optical beam path.

25 Claims, 8 Drawing Sheets

(56) References Cited

U.S. PATENT DOCUMENTS

| | | |
|---|---|---|
| 2006/0098926 A1 | 5/2006 | Shelnut |
| 2006/0103378 A1 | 5/2006 | Pakdaman |
| 2006/0109015 A1* | 5/2006 | Thacker ................. G02B 6/12 |
| | | 324/755.07 |
| 2011/0279109 A1 | 11/2011 | Masuda |
| 2011/0279812 A1 | 11/2011 | Masuda |
| 2012/0325775 A1 | 12/2012 | Thiel |
| 2013/0001405 A1 | 1/2013 | Walker |
| 2013/0308898 A1 | 11/2013 | Doerr |
| 2014/0294342 A1 | 10/2014 | Offrein |
| 2016/0085038 A1 | 3/2016 | Decker |
| 2016/0238793 A1 | 8/2016 | Frankel et al. |
| 2017/0194309 A1 | 7/2017 | Evans |
| 2019/0339327 A1 | 11/2019 | Huebner |

FOREIGN PATENT DOCUMENTS

| | | |
|---|---|---|
| CN | 102123561 A | 7/2011 |
| CN | 104541207 A | 4/2015 |
| CN | 106062568 A | 10/2016 |
| CN | 107427223 A | 12/2017 |
| EP | 3059622 A1 | 8/2016 |
| TW | 201303332 A | 1/2013 |
| WO | WO2018053440 A1 | 3/2018 |

OTHER PUBLICATIONS

Taiwanese office action and search report, with translation thereof, for corresponding TW appl No. 108112346, dated Dec. 5, 2022.
Chinese Office Action and Search Report, with translation thereof, for corresponding CN Appl No. 2019800225561, dated Oct. 21, 2021.
International Search Report with Written Opinion for corresponding PCT/EP2019/058777, dated Jul. 29, 2019 (12 pages).
Chinese Office Action, with translation thereof, for corresponding CN Appl No. 2019800225561, dated Aug. 23, 2023.

* cited by examiner

ELECTRO-OPTICAL CIRCUIT BOARD FOR CONTACTING PHOTONIC INTEGRATED CIRCUITS

CROSS-REFERENCE TO RELATED APPLICATIONS

The present application is a continuation of, and claims benefit under 35 USC 120 to, international application PCT/EP2019/058777, filed Apr. 8, 2019, which claims benefit under 35 USC 119 of German Application No. 10 2018 108 283.5, filed Apr. 9, 2018. The entire disclosure of these applications are incorporated by reference herein.

FIELD

Various examples of the disclosure relate to techniques for contacting photonic integrated circuits (PICs), for instance for testing the PICs.

BACKGROUND

In a manner similar to that in the case of electronic integrated circuits, in PICs a multiplicity of passive and/or active optical and optoelectronic components are assembled on a common substrate, for example a semiconductor wafer, to form complex circuits. In this case, traditional optical components such as filters or couplers, for example, can be replaced by more compact integrated optical components. The various components of the PIC are connected to one another via optical waveguides near the surface of the PICs.

Such PICs have become more interesting for example in recent years with the major growth in data traffic on the Internet, since signal processing circuits which have sufficient bandwidth and which operate efficiently are used here. Apart from telecommunications and data transmission applications, PICs are also of interest for other applications such as sensor technology and for applications in the life sciences.

The process for producing such PICs is similar to the process for producing conventional electronic integrated circuits or microelectromechanical systems (MEMS) or microoptoelectromechanical systems (MOEMS). In contrast to these conventional technologies, however, for PICs only a small number of test methods exist which can be used to efficiently check such circuits during the production process or else afterwards.

For testing the PICs, in particular the waveguide structures therein, it is typically desirable to couple light into the waveguide structures of the PIC and/or to detect light from the PIC, in particular from the waveguide structures. For this purpose, the PICs have optical interfaces configured to receive and/or emit light.

It is conventional practice for this purpose for light-guiding fibres, for example glass fibres, to be aligned and thus positioned with respect to the PIC to be tested. Since this generally involves a high accuracy in the range of less than 1 µm, a comparatively long time is often used for this, which can make the testing very time-consuming. Therefore, such testing is often suitable only to a limited extent for high numbers, or can be time- and cost-intensive for such numbers, since the positioning is generally carried out before each test and for each circuit separately.

For these reasons, many present-day tests of PICs are topological analyses and functional checking of the finished components.

PICs—besides optical components—often also include electrical components. In such a hybrid embodiment, the testing can be even more complex.

SUMMARY

The disclosure seeks to provide improved possibilities for contacting such PICs, such as in association with functional tests.

In some embodiments, an electro-optical circuit board is configured for contacting a PIC. The electro-optical circuit board includes at least one electrical conductor track. The at least one electrical conductor track extends between a front side of the electro-optical circuit board and a rear side of the electro-optical circuit board. The electro-optical circuit board is configured to contact an electrical interface of the PIC positioned adjacent to the rear side. The electro-optical circuit board also includes at least one optical beam path. The optical beam path, too, extends between the front side of the electro-optical circuit board and the rear side of the electro-optical circuit board. The optical beam path is configured to contact an optical interface of the PIC positioned adjacent to the rear side.

The electro-optical circuit board (EOCB), can implement both electrical contact functionality and optical contact functionality. One exemplary implementation of an EOCB is described e.g. in: US 2004/0037512 A1.

The optical beam path can thus guide a light beam.

In this case, the rear side of the EOCB is that side which faces the PIC during use as intended; while the front side of the EOCB is the opposite side relative to the rear side and thus faces away from the PIC.

The electrical contacting can make it possible to transmit electrical signals to the PIC and/or to receive electrical signals from the PIC. The optical contacting—sometimes also referred to as optical addressing—can make it possible to transmit optical signals and/or to receive optical signals from the PIC.

The EOCB can—using the at least one electrical conductor track—transmit electrical signals, from and/or to the PIC. The EOCB can—using the at least one beam path—also transmit optical signals—i.e. light beams—, from and/or to the PIC. The electrical and/or optical signals can provide a test functionality in relation to the PIC. By way of example, system states of the PIC can be read out or written in.

The EOCB can have a layer structure, for example. The layer structure can have a plurality of layers extending in a lateral plane of the electro-optical circuit board. Some of the layers can be electrically conductive and be formed for example from metal (metal layers). These metal layers then contribute to providing the electrical contact functionality and can be used for implementing the at least one electrical conductor track.

For example, lateral conductor tracks can be formed in the metal layers. For example, a network of conductor tracks can be defined by laterally structured etching. It can also be possible to produce vertical connections between a plurality of vertically spaced-apart metal layers, sometimes referred to as "via". An electrical conductor track can produce an electrical connection between the front side and the rear side of the EOCB. For example, an electrical conductor track can extend between an electrical coupling point at the front side of the EOCB and an electrical coupling point at the rear side of the EOCB. The electrical coupling point at the rear side of the EOCB can be configured to produce an electrical contact with a corresponding electrical interface of the PIC. The electrical coupling point at the front side of the EOCB can be configured to produce an electrical contact with an external electrical testing device, for example with a tip probing station, etc.

The layer structure of the EOCB can also have one or more transparent layers. For example, it is possible to produce transparent layers made from glass or a polymer. Within a transparent layer, optical waveguides can be defined, for instance by lateral variation of the refractive index of the corresponding material. It is also possible to define elements that are effective in terms of geometric optics, for example lenses or deflection elements such as mirrors or prisms. What can be achieved as a result is that an optical beam path extends between an optical coupling point at the front side of the EOCB and an optical coupling point at the rear side of the EOCB. In this case, it is possible to attain a vertical extent and/or a lateral extent of the optical beam path through waveguides and/or optical elements.

Through the use of an EOCB, a particularly simple contacting of the PIC can be effected. This is because it may be possible, for example, for a topography of the rear side of the EOCB to be adapted to a topography of the PIC. This means that a lateral arrangement of coupling points which are formed by the at least one electrical conductor track and/or by the at least one optical beam path can be adapted to a topography of the electrical and/or optical interfaces of the PIC. In the case of a high integration density of the PIC, this can mean that an average distance between adjacent coupling points at the rear side of the EOCB is comparatively small, for example in the micrometres range. For example, the average distance between the coupling points at the rear side can be less than an average distance between coupling points at the front side of the EOCB. This can make it possible, in an automated manner, to produce an electrical and/or optical contact with the PIC via the coupling points on the front side of the EOCB particularly reliably because only a comparatively lower positioning accuracy is used. By way of example, electrical tip testing devices could be used in which electrical contact tips are positioned automatically on contact pads or contact sockets which implement the electrical coupling points on the front side of the EOCB. By way of example, a light beam, through a suitable scanning device of an optical testing device, could be received by an optical coupling point on the front side of the EOCB or be transmitted to the optical coupling point. Both the positioning of a corresponding electrical test tip and the positioning of a light beam through an optical scanner can be less complex on account of the comparatively larger average distance between the coupling points on the front side of the EOCB. The EOCB can provide a transmission functionality for the electrical and optical contacting, from a high positioning tolerance on the front side to a high positioning resolution on the rear side.

Various techniques can be used for implementing the at least one electrical conductor track. By way of example, it would be possible for the at least one electrical conductor track to have an electrical contact at the front side of the EOCB. The electrical contact can implement the electrical coupling point. By way of example, the electrical contact could be embodied as a contact pad or a contact socket. An implementation as a plug would also be possible. It would alternatively or additionally be possible for the electrical conductor track to include an electrical test tip at the rear side of the EOCB. In this case, the test tip can provide the electrical coupling point at the rear side.

Various implementations of the at least one optical beam path are also conceivable. The at least one optical beam path can be defined e.g. at least partly by a lens and/or a deflection element. This means that the lens and/or the deflection element—for example a prism or a mirror—can be arranged in the optical beam path. The lens and/or the deflection element can guide the optical beam path. By way of example, the lens and/or the deflection element could be embodied as a micro-optical unit. A micro-optical unit can be formed e.g. via a multi-photon polymerization process.

In the multi-photon polymerization process, for example, a starting material can be applied on the EOCB. The properties of the starting material can be variable by exposure with electromagnetic radiation. Then, using spatially resolved exposure, a three-dimensional starting structure can be written and the starting material can be removed apart from the starting structure. The starting structure can be moulded into a target material of which the micro-optical unit to be produced is intended to consist. Corresponding techniques are described e.g. in: US 2012/0325775 A1.

It would be possible, in principle, for the lens and/or the deflection element to be embedded into the layer structure of the EOCB. For this purpose, via an etching process, for example, a depression could be provided in the layer structure and then the lens and/or the deflection element could be arranged in the depression. This can make possible a particularly space-saving integration, for instance if the PIC itself has a surface topography that involves a thin EOCB.

It would be possible for the lens and/or the deflection element to be mounted on an outer surface of the layer structure and to extend away from the layer structure. By way of example, the lens and/or the deflection element could be mounted on an outer surface of the EOCB that forms the rear side. As a result, it may be possible to implement a particularly flexible coupling between the at least one optical beam path of the EOCB and the PIC. By way of example, a lateral coupling to a facet interface at a vertical edge of the PIC could also be implemented.

The at least one optical beam path can be configured to provide a vertical optical coupling to the PIC and/or to provide a lateral optical coupling to the PIC. For example, in the case of the vertical optical coupling, the orientation of the at least one beam path can be oriented vertically with respect to an outer surface of the layer structure of the EOCB that defines the rear side. A lateral optical coupling can use a lateral orientation of the at least one beam path with respect to the outer surface.

The at least one optical beam path can be defined at least partly by an optical waveguide. The waveguide can be formed in at least one optically transparent layer of the layer structure of the EOCB. This can be carried out e.g. using a variation of the refractive index of the material forming the optically transparent layer.

It would be possible to use window structures for defining the optical beam path. For example, it would be possible for the EOCB to include a cutout in at least one metallic layer of the layer structure. The cutout can be arranged in the optical beam path. In this way, the optical beam path can vertically cross a metallic layer.

It would be possible to use beam splitters. The at least one optical beam path can then have branching junctions. As a result, it may be possible to implement more complicated optical test functionalities in which e.g. different regions of the PIC are addressed simultaneously via coherent light. A branching junction can make it possible to achieve an assignment of a plurality of optical coupling points on the rear side of the EOCB to a common optical coupling point on the front side of the EOCB.

In some embodiments, a system includes the EOCB and the PIC. The system can optionally also include at least one testing device—for instance an electrical testing device and/or an optical testing device. The at least one testing device can be configured to transmit electrical signals and/or optical signals from and/or to the PIC via the EOCB. By way of example, the at least one testing device could be configured to optically contact the PIC via a light beam that is transmitted along at least one optical beam path of the EOCB. The at least one testing device could also be configured to electrically contact the PIC via electrical signals that are transmitted along at least one electrical conductor track of the EOCB.

The optical testing device can include a light source and a scanning device. The optical testing device can drive the light source and the scanning device to emit a light beam to the EOCB. A transmission aperture for the light beam can thus be moved via the scanning device.

The optical testing device can also include a detector. The optical testing device can drive the detector and the scanning device to receive a light beam from the EOCB. In that case, a detector aperture for the light beam can be moved via the scanning device.

The scanning device can move/tilt the transmission aperture and/or the detector aperture of the optical testing device.

In some examples, the optical testing device is configured to drive the scanning device for positioning the light beam with respect to a plurality of optical coupling points on the front side of the EOCB. To put it more precisely, the scanning device can be driven for positioning the transmission aperture and/or the detector aperture for the light beam with respect to the plurality of optical coupling points. That means e.g. that the light beam can be scanned, such that the latter is incident e.g. on a specific one of the plurality of optical coupling points; or that a light beam can be received selectively by one of the plurality of optical coupling points.

In some examples, it would also be possible for the testing device to be configured to drive the scanning device for the alternating and repeated positioning of the light beam on the plurality of optical coupling points. That means that it would be possible to change back and forth between the different optical coupling points with a specific scanning frequency. As a result, it would be possible to contact a large number of optical coupling points via time division multiplexing—without having to provide for instance a correspondingly large number of physical optical contacts, for instance glass fibres.

In some embodiments, it would also be possible to drive the scanning device for positioning the light beam within a (single) optical coupling point on the front side of the EOCB. The scanning device can be driven for positioning the transmission aperture and/or the detector aperture for the light beam within the optical coupling point. A fine positioning can be carried out in this way.

The electrical testing device can be configured to transmit electrical signals from and/or to the PIC via the EOCB. The optical testing device can be configured to transmit optical signals or light beams from and/or to the PIC via the EOCB.

In some embodiments, a method for contacting a PIC includes electrically contacting the PIC via at least one electrical conductor track. The at least one electrical conductor track extends between a front side of an EOCB and a rear side of the EOCB. The method also includes optically contacting the PIC via at least one optical beam path. The at least one optical beam path extends between the front side of the EOCB and the rear side of the EOCB.

Optically contacting could include for example emitting a light beam to the EOCB. Alternatively or additionally, optically contacting could also include receiving a light beam from the EOCB.

By way of example, the method could be carried out by at least one testing device. By way of example, the method could be carried out by a controller for at least one testing device. By way of example, an optical testing device and an electrical testing device can be used.

It is possible to achieve effects that are comparable with the effects that can be achieved for the EOCB in accordance with a further aspect.

In some embodiments, a method for producing an EOCB configured for contacting a PIC includes forming at least one electrical conductor track. The at least one electrical conductor track extends between a front side of the EOCB and a rear side of the EOCB. The at least one electrical conductor track is also configured to contact an electrical interface of the PIC positioned adjacent to the rear side. The method furthermore includes forming at least one optical beam path extending between the front side and the rear side of the EOCB. The at least one optical beam path is configured to contact an optical interface of the PIC positioned adjacent to the rear side.

It is possible to achieve effects that are comparable with the effects that can be achieved for the EOCB in accordance with a further aspect.

The method can furthermore include forming a micro-optical unit at the EOCB via a multi-photon polymerization process.

By way of example, the micro-optical unit could include a lens and/or a deflection element. The lens and/or the deflection element could be embedded into a layer structure of the EOCB. It would be possible for the micro-optical unit to be mounted on an outer surface of the layer structure and to extend away from the layer structure.

In some embodiments, a method for optically contacting a PIC can include coarse positioning via a relative movement of an optical or electro-optical circuit board relative to the PIC. The method may furthermore include fine positioning via movement of a light beam within an optical coupling point of the optical circuit board through a scanning device.

The features set out above and features that are described below may be used not only in the corresponding combinations explicitly set out, but also in further combinations or in isolation, without departing from the scope of protection of the present disclosure.

DETAILED DESCRIPTION

Figure 1:
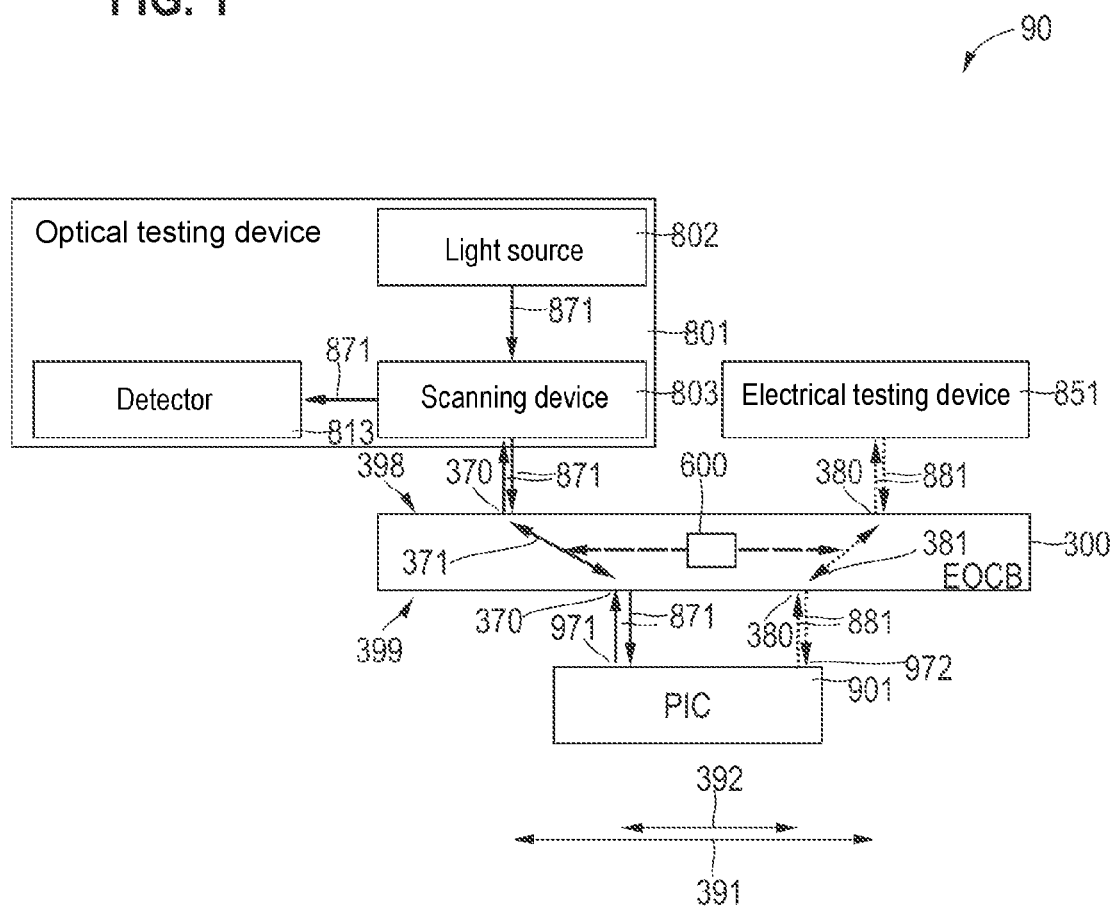
FIG. 1 schematically illustrates a system including an EOCB in accordance with various examples.

The present disclosure is explained in greater detail below on the basis of preferred embodiments with reference to the drawings. In the figures, identical reference signs designate identical or similar elements. The figures are schematic representations of different embodiments of the disclosure. Elements illustrated in the figures are not necessarily depicted as true to scale. Rather, the different elements illustrated in the figures are reproduced in such a way that their function and general purpose become comprehensible to the person skilled in the art.

Techniques for promoting the testing of a PIC are described below. The electrical functionality and also the optical functionality of the PIC can be tested in this case. For this purpose, the PIC can be both electrically contacted and optically contacted. Electrical signals and/or optical signals or light beams can be transmitted to the PIC or be received from the PIC.

Various techniques described below use an EOCB for contacting the PIC. The EOCB can provide both the electrical contacting and the optical contacting. The EOCB can transmit electrical signals and/or optical signals. The EOCB can thus provide probe card functionality.

In accordance with various examples, this includes integration of an optically transparent window and/or integration of focusing optical elements or optical deflection elements—for example of lenses or prisms—in and/or on the EOCB. Alternatively or additionally, light guidance through waveguides integrated in the EOCB can also be made possible. Complex topographies are made possible for a corresponding optical beam path.

Such techniques make it possible to distribute and to collect light beams along one or more optical beam paths within the EOCB.

Such concepts can be employed for testing individual PICs. The topography of the EOCB can then be adapted to the topography of the respective PIC. For example, electrical and/or optical coupling points can be arranged at a rear side of the EOCB in a manner opposite or corresponding to electrical and/or optical interfaces of the PIC.

Lateral coupling via facets of a substrate material of the PIC is also possible. For this purpose, it is possible to integrate e.g. optical elements which deflect light towards in-plane waveguides of the PIC, for example prisms or mirrors. Such optical deflection elements can generally be combined with additional focusing elements in order to achieve an adaptation to the numerical aperture of waveguides in the PIC.

As a general rule, techniques of micro-optics production can be used for the optical elements described herein. By way of example, a multi-photon polymerization process, for example a two-photon polymerization process, can be used.

Through the use of the EOCB it may be possible to test both the electrical functionality of the PIC and the optical functionality of the PIC particularly rapidly and efficiently. For example, it may be unnecessary to implement two sequential test processes—one for the electrical test and one for the optical test—, for instance using separate pieces of equipment. Rather, it may be possible to test the optical functionality and the electrical functionality in a manner at least partly overlapping in time. This reduces the test time, which increases a throughput of test specimens.

FIG. 1 illustrates aspects with respect to one exemplary system 90. The system 90 includes an optical testing device 801 and an electrical testing device 851. The devices are configured to test the functionality of a PIC 901.

The optical testing device 801 includes a light source 802 for generating a light beam 871 (the designation light beam is used here for easier designation, and includes the possibility of a plurality of partial light beams and/or a beam bundle). The light beam 871 can implement optical signals. In one example, the light source 802 is a laser light source. In some variants, the light source 802 can generate polarized light, for example using a polarizer, in order to illuminate the PIC 901 with polarized light.

In the example in FIG. 1, the optical testing device 801 also includes a scanning device 803, by which a position of the light beam 871 on an EOCB 300 is variable. For this purpose, the scanning device 803 can have, for example, one or more moveable scanner mirrors (e.g. Galvano mirrors or MEMS mirrors) and/or spatial light modulators. As a result, the position of the light beam 871 on a lateral surface of the EOCB 300 can be set precisely via the scanning device 803. For example, the light beam 871 can be positioned on different optical coupling points 370 on the front side 398 of the EOCB 300. Different optical coupling points 370 on the front side 398 can be connected to different optical coupling points 370 on a rear side 399 of the EOCB 300 via corresponding optical beam paths 371. As an alternative or in addition to such a positioning of the light beam 871 on different optical coupling points 370 on the front side 398 of the EOCB 300, the optical testing device 801 can also be configured to position the light beam 871 laterally within an optical coupling point 370 on the front side 398. For example, this positioning could be implemented in accordance with a search pattern, formed for example in spiral fashion. As a general rule, the search pattern can be formed in two-dimensional fashion. A different exemplary search pattern could scan lines, or scan in a star-shaped fashion. The search pattern can be implemented by 2-D scanning via the scanning device 803.

The positioning via the search pattern could be monitored: the positioning via the search pattern could be coupled e.g. with a feedback loop implemented by the optical testing device 801 and/or the electrical testing device 851: the light beam 871 could be scanned along the search pattern for positioning purposes until a measurement signal (e.g. obtained electrically or obtained optically) exceeds or falls below a specific predefined threshold value. This threshold value comparison may then be indicative of the correct positioning of the light beam 871 on the PIC 901, i.e. e.g. centred on an optical interface 971 of the PIC 901. An electrical functionality and/or an optical functionality of the PIC 901, initiated by the correct positioning of the light beam 871 could be used for this purpose. By way of example, the correct positioning of the light beam 871 on the PIC 901 could be passed back to the electrical testing device 851 via the EOCB 300 in the form of an electrical signal via an optoelectronic transducer element (for instance an optoelectronic element 600). The scanning along the search pattern can then be ended depending on the threshold value comparison. Such techniques benefit if firstly the electrical coupling is carried out (in order to obtain the measurement signal) and then—on the basis of the measurement signal— the optical coupling is carried out in a monitored manner. In a different example, the back-reflection or absorption of the light beam 871 itself could be checked: a successful optical contacting can be assumed if the back-reflection decreases (i.e. if more light is coupled into the PIC 901).

In such variants, a lateral dimensioning of the optical coupling point 370 can be larger than the cross section of the light beam 871, with the result that such a lateral positioning of the light beam 871 within an optical coupling point 370 on the front side 398 also brings about a lateral positioning of the light beam 871 on the rear side 399 or on the PIC 901. As a result, it is possible to bring about a fine positioning of the light beam 871 on the PIC 901, thereby making possible an efficient optical contacting of the PIC with low insertion loss. In general, an optical aperture of the EOCB 300 can enable such a positioning of the light beam, i.e. the aperture can be dimensioned such that it is larger than the cross section of the light beam 871.

In other examples, a multiplicity of glass fibres or other light-guiding fibres can also be used instead of a scanning device 803. The fibres can be connected via a releasable connection to different optical coupling points 370 on the front side 398, for example via plug connections. A scanning device 803 is then unnecessary.

Different optical coupling points 370 on the front side 398 can be associated with different optical beam paths 371 within the EOCB 300 which lead to different coupling points 370 at a rear side 399 of the EOCB 300. Different optical coupling points 370 at the rear side 399 are in turn assigned to different optical interfaces 971 of the PIC 901.

As illustrated in FIG. 1, light beams 871 emerging from the PIC 901 can also pass along optical beam paths 371 in the EOCB 300 and then be transferred to a detector 813. The detector 813 can include a camera or some other 2D sensor, for example.

The EOCB 300 thus makes it possible to test the optical functionality of the PIC 901 via the forwarding of optical signals or of the light beam 871 between the optical coupling points 370 and along the optical beam paths 371.

In the example in FIG. 1, the system 1 also includes the electrical testing device 851 for testing the electrical functionality of the PIC 901.

For this purpose, the EOCB 300 is configured to forward electrical signals 881 between an electrical coupling point 380 at the front side 398 of the EOCB 300 and an electrical coupling point 380 at the rear side 399 of the EOCB 300 along electrical conductor tracks 381.

The electrical signals 881 are then transferred from the electrical coupling point 380 at the rear side 399 of the EOCB 300 to an electrical interface 972 of the PIC 901. It is also evident from FIG. 1 that the electrical signals 881 can be transmitted in both directions, i.e. from the electrical testing device 851 to the PIC 901 and vice versa.

In principle, it is possible to use various techniques for electrically contacting the PIC 901 via the EOCB 300. By way of example, the electrical coupling points 380 at the rear side 399 of the EOCB 300 can be formed by electrical test tips. It would be possible for the electrical coupling points 380 at the front side 398 to be formed by electrical contacts, for example contact pads for a tip test station, or by sockets and/or plugs.

It is also possible to use various techniques for the optical contacting. Exemplary techniques for optically contacting the PIC 901 are illustrated in association with FIG. 2.

In the example in FIG. 1, the electrical testing device 851 and the optical testing device 801 are shown as separate units. Both the electrical testing device 851 and the optical testing device 801 can be formed by a common unit. It would also be possible to provide a common central control unit (not illustrated in FIG. 1) The central control unit can be configured to drive both the optical testing device 801 and the electrical testing device 851. Synchronized operation of the testing devices 801, 851 can be made possible as a result. By way of example, the optical test and the test of the optical functionality of the PIC 901 and the test of the electrical functionality of the PIC 901 could be carried out in an interlinked manner. By way of example, scenarios are conceivable in which the optical functionality of the PIC 901 has an influence on the electrical functionality of the PIC 901 and/or in which the electrical functionality of the PIC 901 has an influence on the optical functionality of the PIC 901. It may then also be possible, during synchronized operation of the testing devices 801, 851, to test such interactions between the optical and electrical functionalities of the PIC 901. In one example, an optical signal could be transmitted via the EOCB 300 to the PIC 901, wherein the optical signal brings about an electrical response of the PIC 901. Then—using the synchronized operation—an electrical signal corresponding to the electrical response of the PIC 901 to the optical signal could be received via the EOCB 300. It is then possible to check whether the electrical response corresponds to faulty operation or fault-free operation of the PIC 901. Such a test of the interaction between optical functionality and electrical functionality of the PIC 901 can be made possible by the simultaneous electrical contacting and optical contacting via the EOCB 300.

In some examples, it is also possible to enable the test of the interaction between the optical functionality and the electrical functionality—as an alternative or in addition to the above-described synchronization of the operation of the testing devices 801, 851—using a suitable embodiment of the EOCB 300. By way of example, it would be possible for the EOCB 300 to have at least one optoelectronic element 600. Examples of optoelectronic elements include: a camera; a photodiode; a light source, such as, for example, a laser or a laser diode; an optical modulator; an optoelectronic or electro-optical transducer; a position-sensitive detection device (PSD); etc. Such an optoelectronic element can then be configured to provide a coupling between one or more electrical conductor tracks 381 and one or more beam paths 371 (illustrated by the horizontal dashed arrow in FIG. 1). In this way, in other words, the optoelectronic element 600 can enable optical signals to be converted into electrical signals (or vice versa). In this way, by way of example, it is in turn possible to test an optical system response of the PIC 901 to an electrical signal or an electrical system response of the PIC to an optical signal. By way of example, it would be possible in this way to test particularly fast system responses of the PIC 901, which are for instance faster than a system clock of the possible synchronization between electrical testing device 851 and optical testing device 801.

Figure 2:
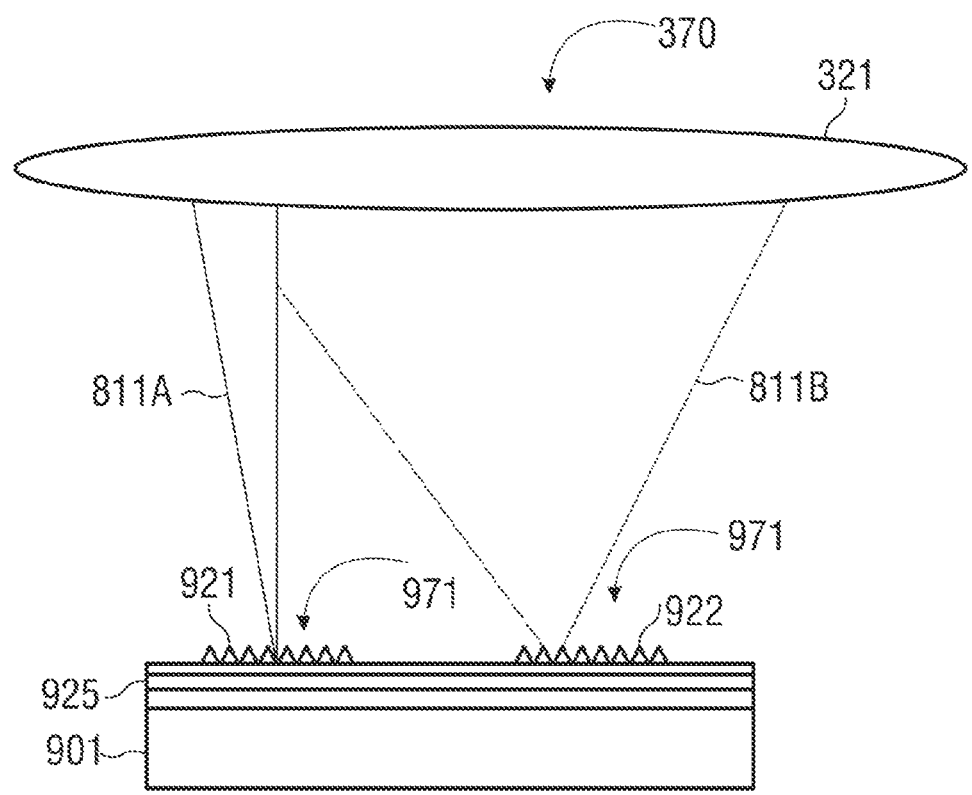
FIG. 2 schematically illustrates a PIC and the optical contacting of the PIC in accordance with various examples.
Figure 3:
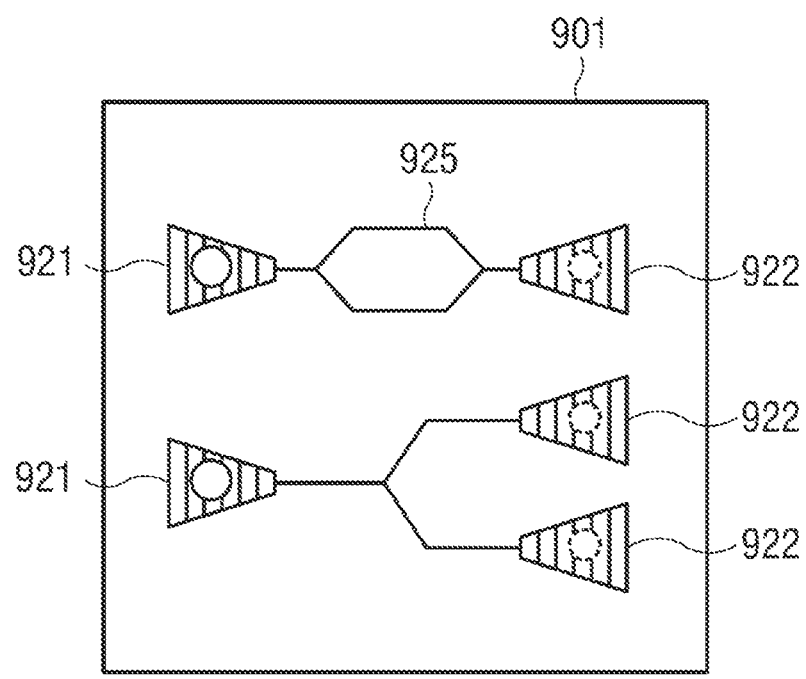
FIG. 3 schematically illustrates a PIC.

FIG. 2 shows a cross-sectional view of a PIC 901 together with an objective lens 321 of the EOCB 300, the illumination light beam 811A and a detection light beam 811B; FIG. 3 shows a plan view of the PIC 901. The PIC 901 in the example in FIGS. 2 and 3 has waveguide structures 925 coupled to further optical components (not illustrated) of the PIC. An input coupling grating 921 and an output coupling grating 922 are provided in order to enable the illumination light beam 811A and the detection light beam 811B respectively to be coupled into and out of the waveguide structures 925. The coupling gratings 921, 922 implement optical interfaces 971. The various input coupling gratings 921 and if desired also the various output coupling gratings 922, via the EOCB as a result of the provision of optical coupling points 370 at the rear side 399 thereof, can be impinged on precisely in order thus to enable test measurements. The coupling gratings 921, 922 couple light in and out of the plane of the waveguides 925 approximately perpendicular to the surface of the PIC 901. This type of coupling gratings has the advantage that they can be employed for different components both at the wafer level (before the dicing of the wafer) and after distribution. An alternative is edge couplers consisting of bevelled waveguides near the chip edge. However, this can only be employed for already diced wafers and singulated chips if these chip margins (end facets) are accessible. The contacting of optical interfaces 971 implemented by end facets as PICS 901 is also possible via the EOCB 300.

Figure 4:
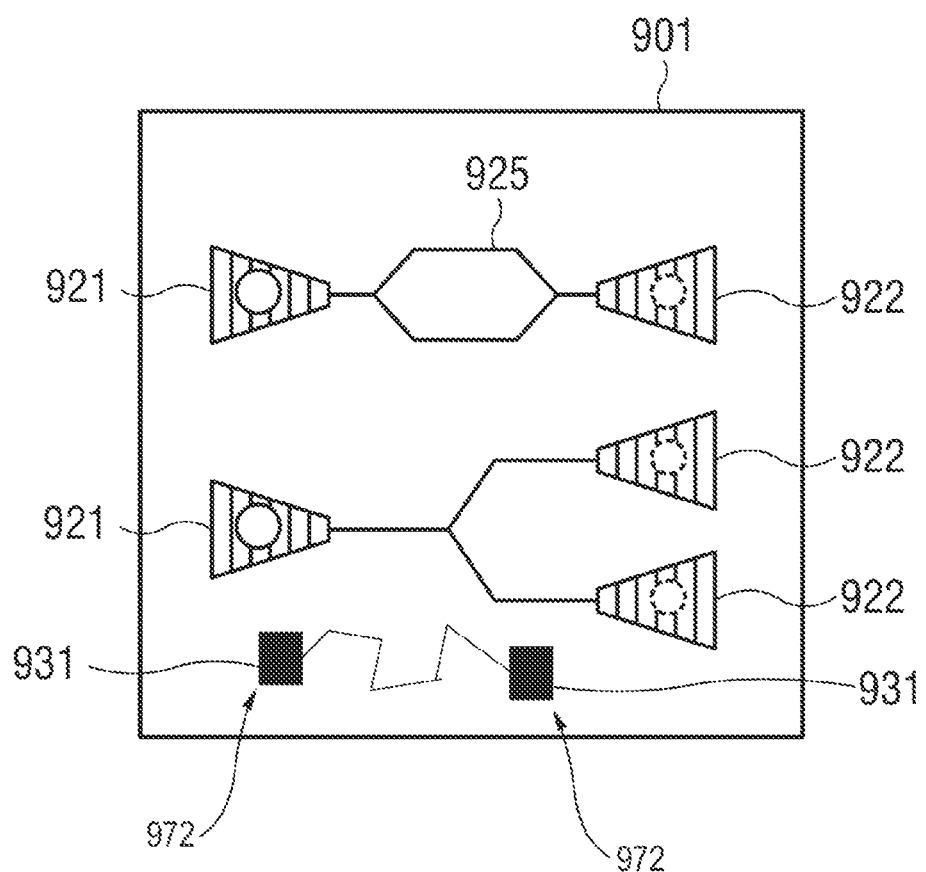
FIG. 4 schematically illustrates a PIC.

FIG. 4 illustrates a further PIC 901. The PIC 901 from FIG. 4 corresponds, in principle, the PIC 901 from FIG. 3, but furthermore includes electrical contact pads 931 which implement electrical interfaces 972 of the PIC 901. It is evident from FIG. 4 that the coupling gratings 921, 922 and the contact pads 931 are at a small lateral distance—typically in the micrometres range. Therefore, the electrical coupling points 380 and the optical coupling points 370 on the rear side 399 of the EOCB 300 are also at a particularly small distance, which can be smaller than the distance between the corresponding coupling points 370, 380 on the front side 398. This corresponds to a transmission functionality of the EOCB 300 that enables simple contacting of the PIC 901. In general, an average distance between the electrical and optical coupling points 370, 380 on the front side 398 can be greater than an average distance between the electrical and optical coupling points 370, 380 on the rear side 399 of the EOCB 300. This is also illustrated in FIG. 5.

Figure 5:
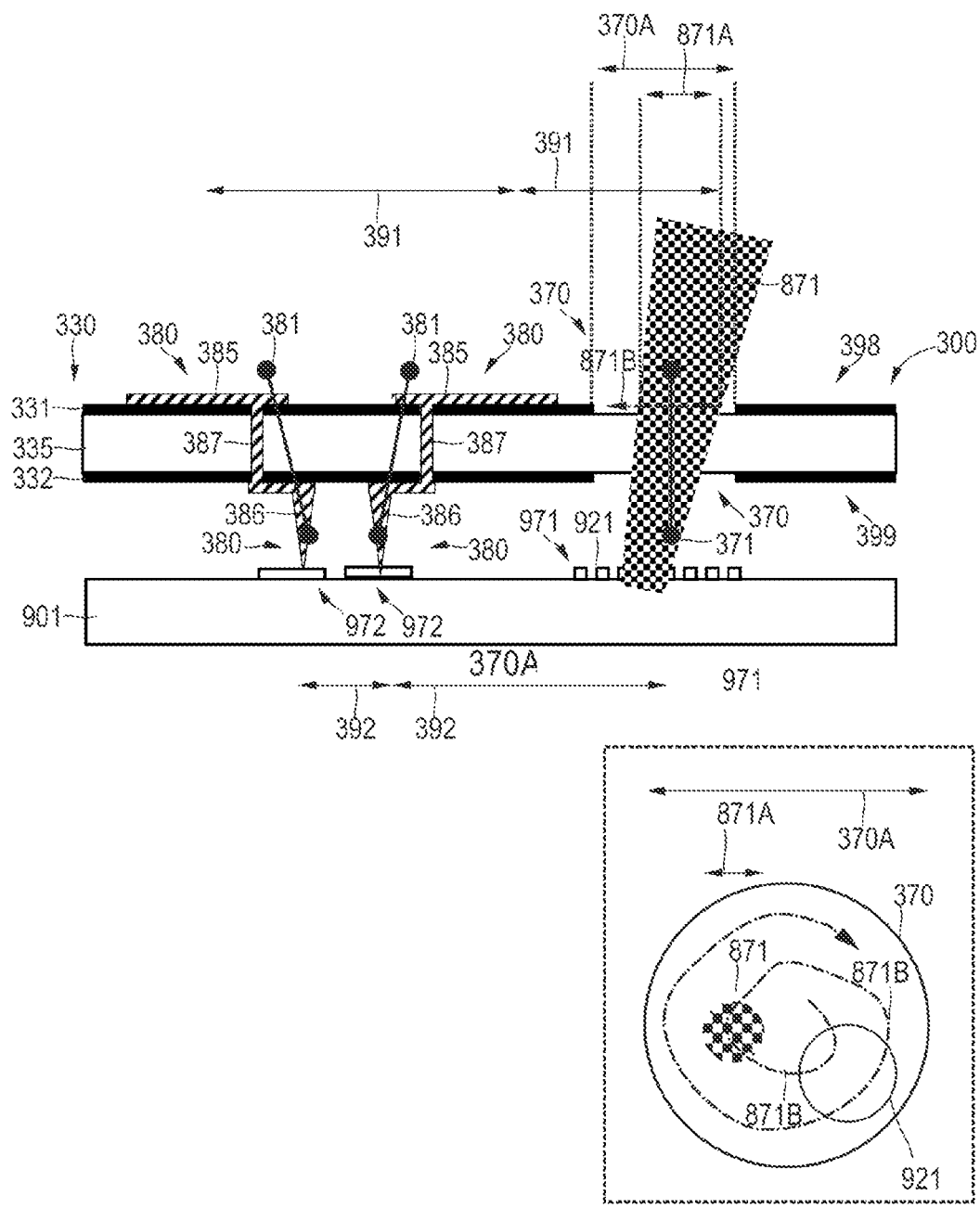
FIG. 5 schematically illustrates an EOCB in accordance with various examples, wherein an inset in FIG. 5 illustrates the positioning of a light beam within an optical coupling point of the EOCB.

FIG. 5 illustrates aspects in relation to the EOCB 300. The EOCB 300 includes a plurality of layers 331, 332, 335 and thus implements a layer structure. The layers 331, 332, 335 are laterally extended. A vertical direction (top-bottom in FIG. 5) is defined perpendicular to the layers.

FIG. 5 illustrates the larger distances 391 between coupling points 370, 380 on the front side 398; and additionally the smaller distances 392 between coupling points 370, 380 on the rear side 399.

By way of example, the EOCB 300 includes metal layers 331, 332, and an optically transparent layer 335.

FIG. 5 illustrates aspects in relation to the electrical conductor track 381. An electrical conductor track 381 includes a contact 385 at a side surface of the EOCB 300 that forms the front side 398. In the example in FIG. 5, the contact 385 is formed by a contact pad 385 having large lateral dimensions, such that e.g. tips of a tip probing station as electrical testing device 851 can be positioned reliably on the contact pads 385. The contact pads 385 therefore form the electrical coupling points 380 on the front side 398. The electrical coupling points 380 on the rear side 399 are formed by electrical test tips 386 of the electrical conductor track 381 in the example in FIG. 5. Electrical vias 387 are arranged between the test tips 386 and the contact pads 385.

FIG. 5 also illustrates aspects in relation to the optical beam path 371. In the example in FIG. 5, the optical beam path is implemented with the aid of the transparent optical layer 335 of the EOCB. In addition, cutouts are provided in the metallic layers 331, 332. As a result, the light beam 871 can pass along the beam path 371 vertically through the EOCB 300, towards an input coupling grating 921.

FIG. 5 illustrates that a lateral diameter 370A of the optical coupling point 370 on the front side 398 of the EOCB 300 is greater than a lateral diameter 871A of the light beam 871 in the region of the EOCB 300. This enables a fine adjustment of the light beam 871 by a lateral offset, for example via the scanning device 803 (c.f. FIG. 1). This makes it possible to ensure that an optical contact with the PIC 901 is produced, that is to say that the light beam 871 is coupled into the input coupling grating 921 with low insertion loss. This is because, using a movement of the light beam 871 relative to the EOCB 300, the light beam 871 can also be moved relative to the PIC 901. This positioning 871B of the light beam 871 within the optical coupling point 370 is identified by arrows in FIG. 5 (cf. also the inset in FIG. 5, which illustrates a plan view of the front side 398 of the EOCB 300, and where a spiral search pattern defining the movement of the light beam 871 within the optical coupling point 370 is discernible).

If the positioning 871B of the light beam 871 is present within the input coupling grating 921, e.g. a corresponding measurement signal could exceed or fall below a threshold value. This can be checked via a feedback loop. In one example, the back-reflection of the light beam 871 could decrease if the positioning 871B of the light beam 871 is present within the optical interface 971 or the input coupling grating 921, i.e. if the insertion loss decreases.

In association with FIG. 5, a scenario was discussed in which the aperture of the beam path 371 is substantially delimited by the lateral dimensions 370A of the optical coupling point 370 on the front side 398. As a general rule it may be worthwhile for the aperture of the beam path 371 to permit such a lateral positioning 871B for the fine positioning of the light beam 871 on the PIC 901, i.e. for the aperture of the beam path 371 along the entire length of the beam path 371 to be dimensioned such that it is larger than the cross section 871A of the light beam 871. This can be effected—as described above—via the scanning device 803.

In the scenario in FIG. 5, the light beam 871 has already been focused, such that the diameter of the light beam 871 is coordinated with the aperture of the input coupling grating 921. In the example in FIG. 6, a lens 321 is provided, which performs this focusing proceeding from a collimated light beam 871. The lens 321 is integrated with the EOCB 300.

Figure 6:
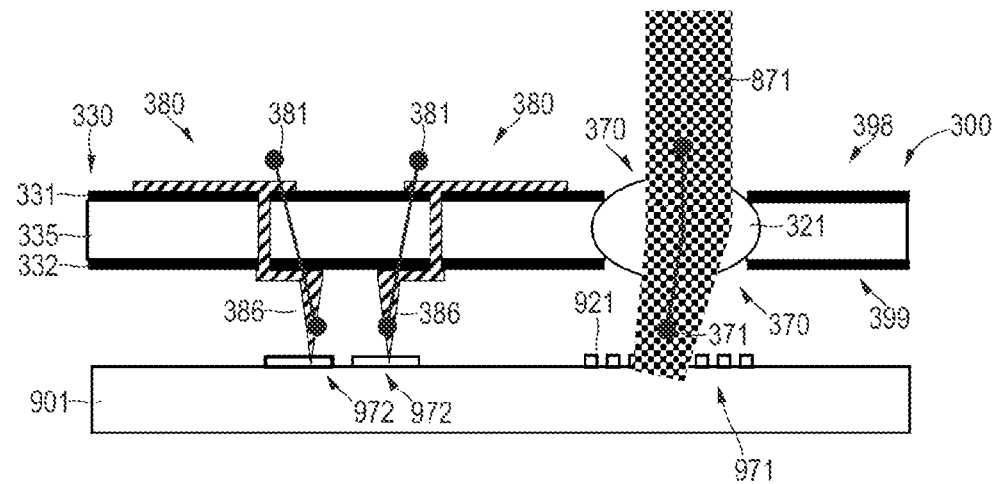
FIG. 6 schematically illustrates an EOCB in accordance with various examples.

Generally, as an alternative or in addition to the lens 321, the EOCB 300 could also include other optical elements, for example a deflection element such as e.g. a prism or a mirror (not illustrated in FIG. 6).

In FIG. 6, the lens 321 is embedded into the layer structure 330 of the EOCB 300. This can be carried out e.g. by etching a cutout in the layers 331, 332, 335 and subsequently introducing the lens 321. For example, the lens 321 could be formed as a micro-optical unit for instance using a multi-photon polymerization process in the bulge obtained as a result of the etching.

Figure 7:
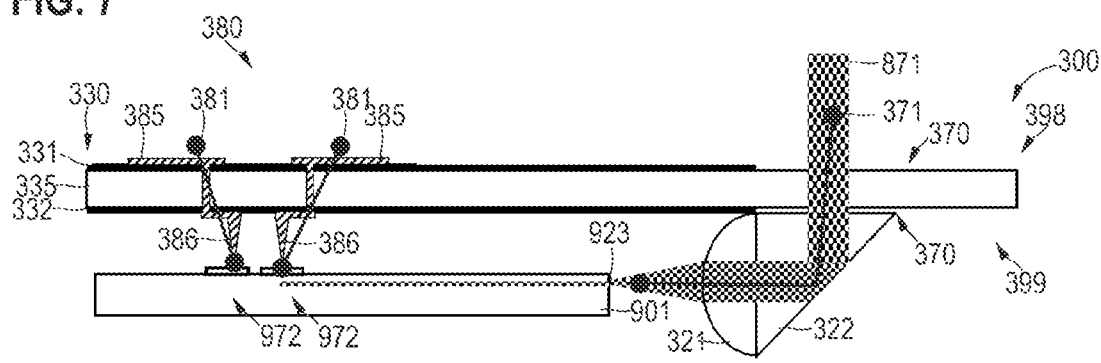
FIG. 7 schematically illustrates an EOCB in accordance with various examples.

By contrast, in the example in FIG. 7, the lens 321 and a prism 322 are not embedded into the layer structure 300. Rather, the lens 321 and the prism 322 are mounted on an outer surface of the layer structure 330 and extend away from the layer structure 330. In this case, it would be possible, in principle, for the optical elements 321, 322 partly to be embedded into the layer structure 330 and partly to be mounted on the layer structure 330 and to extend away from the latter. One such scenario is illustrated for example in FIG. 8.

Figure 8:
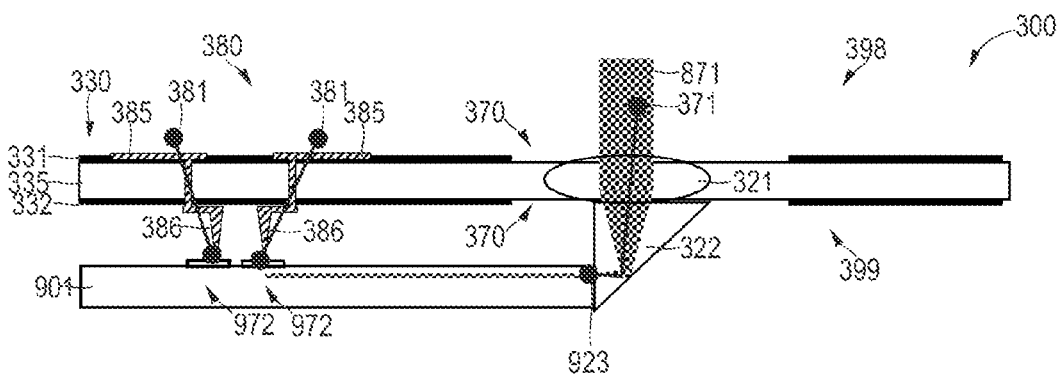
FIG. 8 schematically illustrates an EOCB in accordance with various examples.

In the scenarios in FIG. 7 and FIG. 8, a lateral optical coupling to the PIC 901 is illustrated, via end facets 923 of the PIC 901. This is made possible by the prism 322. By contrast, FIG. 5 and FIG. 6 illustrate a vertical optical coupling to the PIC 901, using the input coupling gratings 921.

Figure 9:
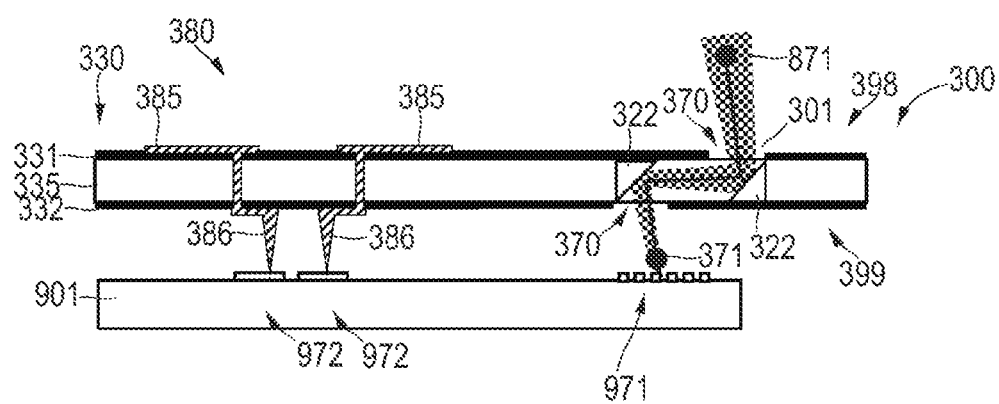
FIG. 9 schematically illustrates an EOCB in accordance with various examples.

FIGS. 5-8 in each case illustrate a beam path 371 extending substantially vertically in the region of the layer structure 330. A lateral guidance of the beam path 371 would also be possible here, as illustrated for example in FIG. 9. In this case, the lateral guidance of the beam path 371 is achieved via prisms 322. Alternatively or additionally, a lateral guidance could also be implemented via a waveguide formed in the optically transparent layer 335.

Figure 10:
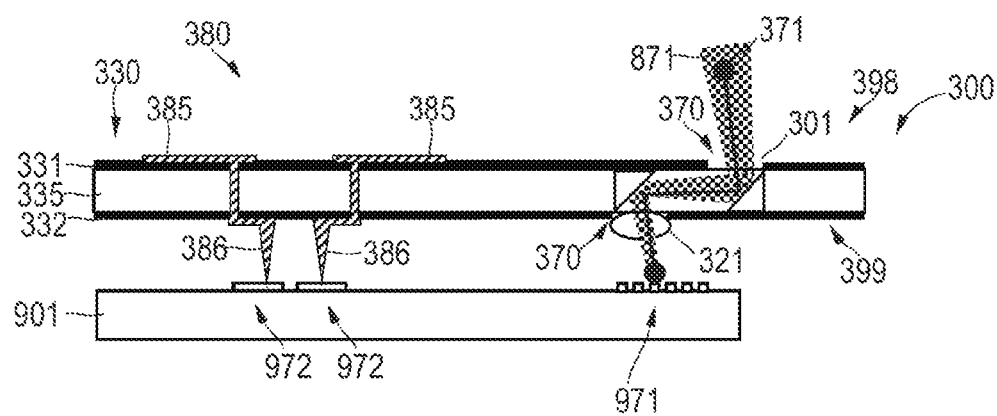
FIG. 10 schematically illustrates an EOCB in accordance with various examples.

FIG. 10 illustrates a scenario in which the lateral guidance of the beam path 371 is combined with a focusing lens 321.

Figure 11:
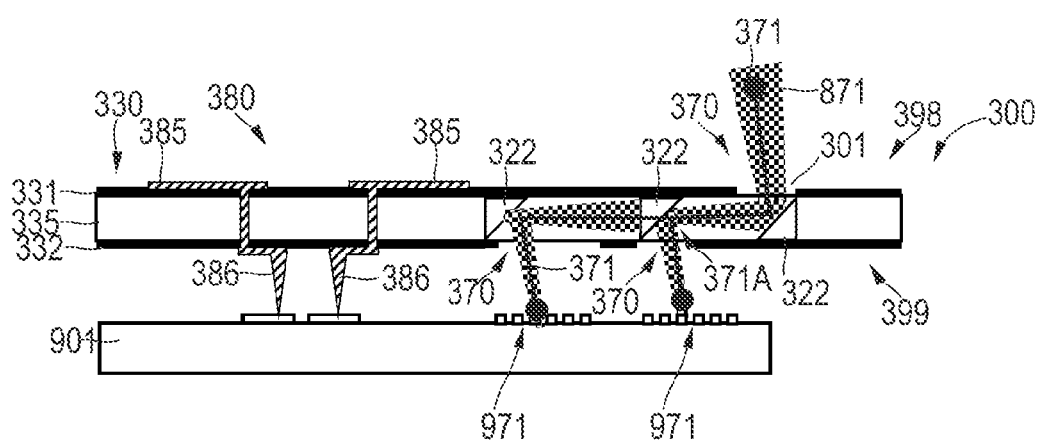
FIG. 11 schematically illustrates an EOCB in accordance with various examples.

FIG. 11 illustrates a variant in which the beam path 371 has a branching junction 371A. For example, one of the prisms 322 implements a beam splitter functionality. As a result, it is possible to address two optical coupling points 370 at the rear side 399 via one optical coupling point 370 at the front side 398 of the EOCB 300.

Figure 12:
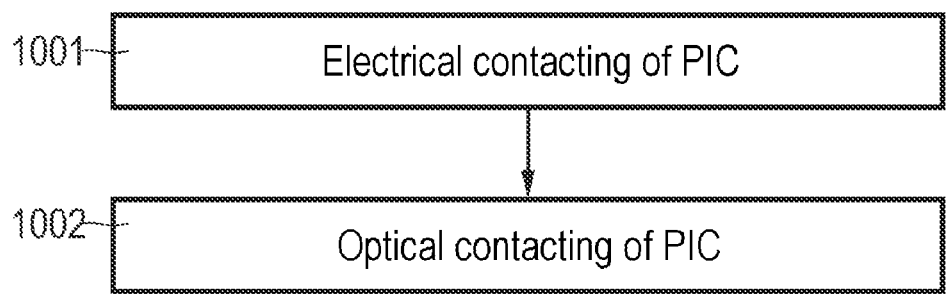
FIG. 12 is a flow diagram of one exemplary method.

FIG. 12 illustrates one exemplary method. Firstly, the electrical contacting of a PIC, for instance of the PIC 901 from the previous figures, is carried out in block 1001. An EOCB, for instance the EOCB 300 from the previous figures, is used for this purpose.

The order of the blocks in FIG. 12 is by way of example.

The EOCB defines one or more electrical conductor tracks extending between a front side and a rear side of the EOCB. As a result, via electrical coupling points arranged at the front side of the EOCB, electrical signals can be exchanged with coupling points arranged at the rear side of the EOCB and further with electrical interfaces of the PIC.

The optical contacting of the PIC is then carried out in block 1002. One or more optical beam paths extending between the front side and the rear side of the EOCB are used for this purpose. As a result, optical signals or light beams can in turn be exchanged between an optical coupling point at the front side of the EOCB and an optical coupling point at the rear side and further with an optical interface of the PIC.

The implementation of a test functionality of the PIC can then be made possible by the exchange of the electrical signals and the light beams.

As a general rule, various techniques are conceivable for implementing the blocks 1001 and 1002. By way of example, it would be possible for firstly—in order to implement the block 1001—a coarse relative positioning of the EOCB with respect to the PIC to be carried out. By way of example, automated techniques using position markings, for instance optical position markings, can be used for this purpose. The EOCB and/or the PIC can be moved with respect to one another, e.g. by translational movement and/or rotation and/or tilting. Accuracy of such a relative positioning using position markings typically lies in the range of approximately 5-50 μm. Such a positioning accuracy is typically sufficient for contacting electrical interfaces of the PIC via test tips of the EOCB. This is because corresponding contact pads that form the electrical interface on the PIC often have corresponding lateral dimensions.

At the same time, such a positioning accuracy in the range of 5-50 μm, in some scenarios, may not be sufficient for reliably producing the optical contact in block 1002. This may be owing to the fact that the corresponding lateral dimensions of optical interfaces of the PIC, for instance coupling gratings (cf. FIG. 2) or facet couplers (cf. FIG. 8), demand a positioning accuracy which corresponds approximately to the wavelength of the light used, i.e. lies for example in the range of 500 nm to 1.5 μm. Such a positioning accuracy in the region of 1 μm typically cannot be achieved, or can be achieved only in a complex manner, by relative positioning of the EOCB relative to the PIC. Therefore, the combination of a scanning device (c.f. FIG. 1, scanning device 803) with the EOCB may be helpful in some embodiments. This is because a fine setting or fine positioning of the lateral position of a light beam on the front side of the EOCB can be carried out via the scanning device, for example with a positioning accuracy of the light beam in the range of 500 nm to 1.5 μm. This fine setting or fine positioning of the lateral position of the light beam on the front side can also bring about a fine setting or fine positioning of the position of the light beam on the PIC 901. This makes it possible to ensure that the light beam impinges on the optical interface of the PIC. Specifically, provision can be made, for example, for the dimension of the optical coupling point on the front side of the PIC to be larger than the beam diameter of the light beam used for the optical contacting, such that the light beam can be moved in relation to the optical beam paths of the EOCB via the fine setting or fine positioning. In other words, apertures of the beam paths of the EOCB can be dimensioned to be large enough to make the fine setting possible; i.e. it is possible, for example, for the aperture of the EOCB to be larger than a diameter of the light beam.

It is thus evident from the process described above that, in some examples, the optical contacting (i) firstly effects the coarse positioning via relative movement of EOCB with respect to PIC, e.g. by translational movement and/or rotation and/or tilting; and (ii) includes the fine positioning via movement of the light beam by the scanning device 803. The coarse positioning in (i) can already make the electrical contacting possible. (ii) could then be carried out in a monitored manner, via electrical measurement signals obtained via the electrical positioning in (i).

Figure 13:
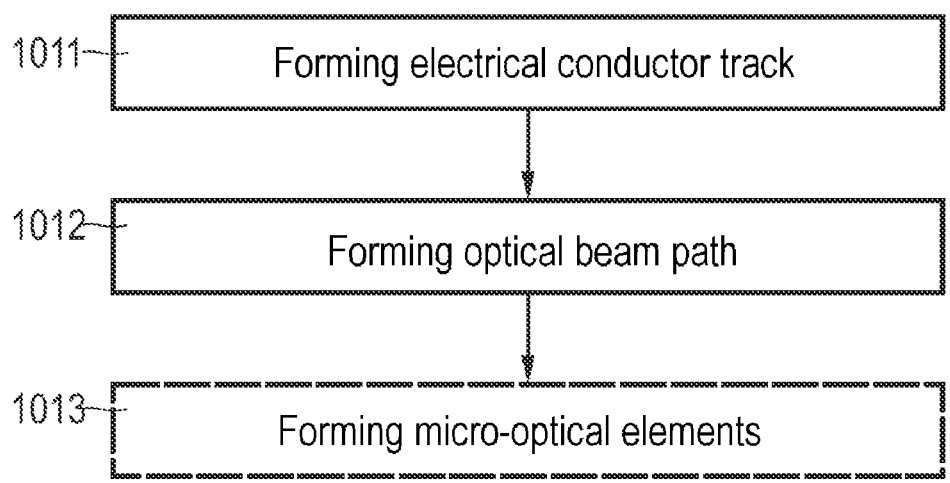
FIG. 13 is a flow diagram of one exemplary method.

As illustrated in FIG. 12, an electrical and optical contacting of the PIC can thus be carried out—via the EOCB. Various effects can be achieved as a result. In accordance with a first effect, the test time can be reduced because it may be unnecessary firstly to carry out the electrical contacting for testing the electrical functionality and then subsequently to carry out the optical contacting for testing the optical functionality. In accordance with a second effect, it may additionally be possible to test interactions between the optical functionality and the electrical functionality of the PIC. In this case, by way of example, the conversion of optical signals into electrical signals by the PIC and/or the conversion of electrical signals into optical signals by the PIC can be tested. FIG. 13 illustrates aspects in relation to one exemplary method. With the method from FIG. 13, it is possible to form an EOCB, for example an EOCB 300 as described above. The EOCB is configured for testing a PIC.

s Firstly, forming one or more electrical conductor tracks in the EOCB is carried out in block 1011. The conductor tracks extend from a front side to a rear side of the EOCB and can produce an electrical contact between electrical coupling points at the front side and the rear side. The conductor tracks can be produced e.g. via suitable lithography and etching processes. By way of example, metal layers of a layer structure of the EOCB could be laterally structured for this purpose. Vias for vertical connection could also be provided. Providing the conductor tracks makes it possible to produce an electrical contact with an electrical interface of a PIC arranged adjacent to the rear side of the EOCB.

Forming one or more optical beam paths is then carried out in block 1012. The optical beam paths also extend between the front side and the rear side of the EOCB. Using the one or more optical beam paths, it may also be possible to contact the PIC, namely via one or more optical interfaces of the PIC.

It is possible for one or more micro-optical elements—for example a lens or a deflection element such as e.g. a prism—to be formed on the EOCB, optional block 1013. This can be carried out e.g. via a multi-photon polymerization process. Corresponding starting material can be applied e.g. on an outer surface of the EOCB and/or into an etched cutout of the EOCB. Accordingly, it is possible to obtain micro-optical elements embedded into a layer structure of the EOCB or else micro-optical elements extending away from an outer surface of the layer structure.

The order of the blocks in FIGS. 12 and 13 is variable. By way of example, it would be conceivable for—referring to FIG. 13—firstly block 1012 and if appropriate block 1013 to be implemented, i.e. for the optical beam path to be formed; and only afterwards for block 1011 to be implemented, i.e. for the electrical conductor track to be formed. For example, the electrical conductor track could be implemented by subsequent lamination and structuring of a metallic layer of a layer structure of the EOCB.

To summarize, subject matter including, but limited to, the following examples has been described above:

Example 1. An electro-optical circuit board (300) configured for contacting a photonic integrated circuit (901) and including:
  at least one electrical conductor track (381, 385, 386, 387) extending between the front side (398) of the electro-optical circuit board (300) and the rear side (399) of the electro-optical circuit board (300) configured to contact an optical interface (972, 931) of the photonic integrated circuit (901) positioned adjacent to the rear side (399), and
  at least one optical beam path (371) extending between the front side (398) of the electro-optical circuit board (300) and the rear side (399) of the electro-optical circuit is board (300) configured to contact an optical interface (971, 921, 922) of the photonic integrated circuit (901) positioned adjacent to the rear side (399).

Example 2. The electro-optical circuit board (300) according to Example 1, furthermore including:
  a lens (321), and/or
  a deflection element,
  wherein the lens (321) and/or the deflection element are/is arranged in the at least one optical beam path (371).

Example 3. The electro-optical circuit board (300) according to Example 2,
  wherein the electro-optical circuit board (300) has a layer structure (300),
  wherein the lens (321) and/or the deflection element are/is embedded into the layer structure (300).

Example 4. The electro-optical circuit board (300) according to Example 2 or 3,
  wherein the electro-optical circuit board (300) has a layer structure (300),
  wherein the lens (321) and/or the deflection element are/is mounted on an outer surface of the layer structure (300) and extend/extends away from the layer structure (300).

Example 5. The electro-optical circuit board (300) according to any of the preceding examples,
  wherein the electro-optical circuit board (300) has a layer structure (300) having at least one metallic layer (331, 332) and having at least one optically transparent layer (335),
  wherein the at least one optically transparent layer (335) forms a waveguide (925) arranged in the at least one optical beam path (371).

Example 6. The electro-optical circuit board (300) according to any of the preceding examples,
  wherein the electro-optical circuit board (300) has a layer structure (300) having at least one metallic layer (331, 332) and having at least one optically transparent layer (335),
  wherein the electro-optical circuit board (300) furthermore includes:
    a cutout of the at least one metallic layer (331, 332), wherein the cutout is arranged in the at least one optical beam path (371).

Example 7. The electro-optical circuit board (300) according to any of the preceding examples,
  wherein the at least one optical beam path (371) has a branching junction (371A).

Example 8. The electro-optical circuit board (300) according to any of the preceding examples,
  wherein the at least one optical beam path (371) is configured to provide a vertical optical coupling to the photonic integrated circuit (901), or to provide a lateral optical coupling to the photonic integrated circuit (901).

Example 9. The electro-optical circuit board (300) according to any of the preceding examples, furthermore including:
  at least one optoelectronic element (600) configured to provide a coupling of the at least one electrical conductor track (381, 385, 386, 387) to the at least one optical beam path (371).

Example 10. The electro-optical circuit board (300) according to any of the preceding examples,
  wherein the at least one electrical conductor track (381, 385, 386, 387) includes:
    an electrical contact at the front side (398) of the electro-optical circuit board (300),
    an electrical test tip at the rear side (399) of the electro-optical circuit board (300).

Example 11. The electro-optical circuit board (300) according to any of the preceding examples,
  wherein an average distance (391) between electrical and optical coupling points (370, 380) on the front side (398) of the electro-optical circuit board (300) is greater than an average distance (392) between electrical and optical coupling points (370, 380) on the rear side (399) of the electro-optical circuit board (300).

Example 12. A system (90), including:
  the electro-optical circuit board (300) according to any of the preceding examples,
  an optical testing device (801) having a light source (802) and a scanning device (803),
  wherein the optical testing device (801) is configured to drive the light source (802) and the scanning device (803) for emitting a light beam (871) to the electro-optical circuit board (300).

Example 13. The system (90) according to Example 12,
  wherein the optical testing device (801) is configured to drive the scanning device (803) for positioning the light beam (871) with respect to a plurality of optical coupling points (370) on the front side (398) of the electro-optical circuit board (300), and/or
  wherein the optical testing device (801) is configured to drive the scanning device (803) for positioning the light beam (871) within an optical coupling point (370) on the front side (398) of the electro-optical circuit board (300), optionally with a search pattern.

Example 14. The system (90) according to Example 12 or 13,
wherein an aperture (370A) of the at least one optical beam path (371) of the electro-optical circuit board (300) is dimensioned such that it is larger than a cross section (871A) of the light beam (871).

Example 15. A system (90), including:
the electro-optical circuit board (300) according to any of Examples 1-11,
the photonic integrated circuit (901),
at least one testing device (801, 851) which is configured to optically contact the photonic integrated circuit (901) via a light beam that is transmitted along the at least one optical beam path (371) of the electro-optical circuit board (300), and is furthermore configured to electrically contact the photonic integrated circuit (901) via electrical signals that are transmitted along the at least one electrical conductor track (381, 385, 386, 387) of the electro-optical circuit board (300).

Example 16. The system (90) according to Example 15, wherein the at least one testing device (801, 851) is configured to test, on the basis of the light beam and the electrical signals, at least one from an electrical functionality of the photonic integrated circuit (901), an optical functionality of the photonic integrated circuit (901) and an interaction between the optical functionality and the electrical functionality of the photonic integrated circuit (901).

Example 17. A method for contacting a photonic integrated circuit (901), the method including:
electrically contacting the photonic integrated circuit (901) via at least one electrical conductor track (381, 385, 386, 387) extending between a front side (398) of an electro-optical circuit board (300) and a rear side (399) of the electro-optical circuit board (300), and
optically contacting the photonic integrated circuit (901) via at least one optical beam path (371) extending between the front side (398) of the electro-optical circuit board (300) and the rear side (399) of the electro-optical circuit board (300).

Example 18. The method according to Example 17, wherein the method furthermore includes:
on the basis of electrically contacting and optically contacting: testing at least one from an electrical functionality of the photonic integrated circuit (901), an optical functionality of the photonic integrated circuit (901) and an interaction between the optical functionality and the electrical functionality of the photonic integrated circuit (901).

Example 19. The method according to Example 17 or 18, wherein the method uses an electro-optical circuit board (300) according to any of Examples 1-10.

Example 20. A method for producing an electro-optical circuit board (300) configured for contacting a photonic integrated circuit (901), wherein the method includes:
forming at least one electrical conductor track (381, 385, 386, 387) extending between the front side (398) of the electro-optical circuit board (300) and the rear side (399) of the electro-optical circuit board (300) configured to contact an electrical interface of the photonic integrated circuit (901) positioned adjacent to the rear side (399).
forming at least one optical beam path (371) extending between the front side (398) of the electro-optical circuit board (300) and the rear side (399) of the electro-optical circuit board (300) configured to contact an optical interface of the photonic integrated circuit (901) positioned adjacent to the rear side (399).

Example 21. The method according to Example 20, furthermore including:
forming a micro-optical element at the electro-optical circuit board (300) via a multi-photon polymerization process.

It goes without saying that the features of the embodiments and aspects of the disclosure described above can be combined with one another. In particular, the features can be used not only in the combinations described but also in other combinations or on their own without departing from the scope of the disclosure.

By way of example, various examples have been described above in which the optical testing device 801 is configured to emit a light beam 871 to the EOCB 300 via the scanning device 803 (cf. also FIG. 2: illumination light beam 811A). That means that a transmission aperture is moved. In various examples, however, it is equally possible for an optical testing device to be used which—as an alternative or in addition to emitting the light beam via the scanning device—is configured to receive a light beam from the EOCB via the scanning device (cf. also FIG. 2: detection light beam 811B). To put it in general terms that means that a detector aperture can also be moved via the scanning device.

What is claimed is:

1. A system, comprising:
an electro-optical circuit board, comprising:
an electrical conductor track extending between first and second sides of the electro-optical circuit board; and
an optical beam path extending between the first and second sides of the electro-optical circuit board; and
an optical testing device, comprising:
a light source; and
a scanning device,
wherein:
the optical testing device is configured to drive the light source and the scanning device so that when the optical testing device drives the light source and the scanning device: i) the light source emits a light beam; and ii) the scanning device varies a location of the light beam on a first side of the electro-optical circuit board;
the electrical conductor track is configured to contact an electrical interface of a photonic integrated circuit adjacent the second side of the electrical conductor track; and
the optical beam path is configured to contact an optical interface of the photonic integrated circuit adjacent the second side of the electrical conductor track.

2. The system of claim 1, wherein the optical testing device is configured to drive the scanning device to vary the position the light beam with respect to a plurality of optical coupling points on the first side of the electro-optical circuit board.

3. The system of claim 1, wherein the optical testing device is configured to drive the scanning device to position the light beam within an optical coupling point on the first side of the electro-optical circuit board.

4. The system of claim 3, wherein the optical testing device is configured to drive the scanning device to position the light beam within the optical coupling point with a search pattern that varies the location of the light beam on the first side of the electro-optical circuit board.

5. The system of claim 1, wherein the optical beam path has an aperture that is larger than a cross section of the light beam.

6. The system of claim 1, wherein:
the scanning device comprises at least one member selected from the group consisting of a moveable scanner mirror and a spatial light modulator; and
when the optical testing device drives the light source and the scanning device, the optical testing device moves the at least one member so to vary the location of the light beam on the first side of the electro-optical circuit board.

7. The system of claim 1, wherein:
the scanning device comprises at least one member selected from the group consisting of a lens in the optical beam path and a deflection element in the optical beam path; and
when the optical testing device drives the light source and the scanning device, the optical testing device moves the at least one member to vary the location of the light beam on the first side of the electro-optical circuit board.

8. The system of claim 7, wherein:
the electro-optical circuit board comprises a layer structure; and
the at least one member is embedded in the layer structure.

9. The system of claim 7, wherein:
the electro-optical circuit board comprises a layer structure;
the at least one member is supported by an outer surface of the layer structure; and
the at least one member extends away from the layer structure.

10. The system of claim 1, wherein:
the electro-optical circuit board comprises a layer structure comprising a metallic layer and an optically transparent layer; and
the optically transparent layer defines a waveguide in the optical beam path.

11. The system of claim 1, wherein:
the electro-optical circuit board comprises a layer structure comprising a metallic layer and an optically transparent layer;
the electro-optical circuit board further comprises a cutout of the metallic layer; and
the cutout is in the optical beam path.

12. The system of claim 1, wherein the optical beam path comprises a branching junction.

13. The system of claim 1, wherein at least one of the following holds:
the optical beam path is configured to provide a vertical optical coupling to the photonic integrated circuit; and
the optical beam path is configured to provide a lateral optical coupling to the photonic integrated circuit.

14. The system of claim 1, wherein the electro-optical circuit board further comprises an optoelectronic element configured to provide a coupling of electrical conductor track to the optical beam path.

15. The system of claim 1, wherein the electrical conductor track comprises:
an electrical contact at the first side of the electro-optical circuit board; and
an electrical test tip at a second side of the electro-optical circuit board, the second side being opposite the first side.

16. The system of claim 1, wherein an average distance between electrical and optical coupling points on the first side of the electro-optical circuit board is greater than an average distance between electrical and optical coupling points on a second side of the electro-optical circuit board, the second side being opposite the first side.

17. The system of claim 1, wherein at least one member selected from the group consisting of the optical testing device and an electrical testing device is configured to:
optically contact the photonic integrated circuit via a light beam transmitted along the optical beam path; and
electrically contact the photonic integrated circuit via electrical signals transmitted along the electrical conductor track.

18. The system of claim 17, wherein the at least one member is configured to test, based on the light beam and the electrical signals: an electrical functionality of the photonic integrated circuit; an optical functionality of the photonic integrated circuit; and/or an interaction between the optical and electrical functionalities of the photonic integrated circuit.

19. The system of claim 1, further comprising the photonic integrated circuit.

20. A method, comprising;
electrically contacting a photonic integrated circuit via an electrical conductor track extending between first and second sides of an electro-optical circuit board; and
optically contacting the photonic integrated circuit via an optical beam path extending between the first and second sides of the electro-optical circuit board,
wherein optically contacting comprises moving a scanning device to:
i) deliver light from the scanning device to different locations on the first side of the electro-optical circuit board; and/or
ii) deliver light from different locations on the first side of the electro-optical circuit board to the scanning device.

21. The method of claim 20, further comprising driving the scanning device to position an optical aperture for the light beam with respect to a plurality of optical coupling points on the first side of the electro-optical circuit board.

22. The method of claim 20, further comprising driving the scanning device to position an optical aperture for the light beam within an optical coupling point on the first side of the electro-optical circuit board.

23. The method of claim 20, further comprising, based on electrically contacting and optically contacting, testing at least one member selected from the group consisting of an electrical functionality of the photonic integrated circuit, an optical functionality of the photonic integrated circuit, and an interaction between the optical and electrical functionalities of the photonic integrated circuit.

24. The method of claim 20, wherein the scanning device comprises at least one member selected from the group consisting of a moveable scanner mirror and a spatial light modulator.

25. The method of claim 20, wherein the scanning device comprises further comprises at least one member selected from the group consisting of a lens in the optical beam path and a deflection element in the optical beam path.

* * * * *

UNITED STATES PATENT AND TRADEMARK OFFICE
CERTIFICATE OF CORRECTION

PATENT NO. : 11,946,950 B2
APPLICATION NO. : 17/062954
DATED : April 2, 2024
INVENTOR(S) : Philipp Huebner and Stefan Richter It is certified that error appears in the above-identified patent and that said Letters Patent is hereby corrected as shown below:

In the Specification

Column 1, Line 9, delete "USC" and insert -- U.S.C. --.

Column 1, Line 11, delete "USC" and insert -- U.S.C. --.

Column 11, Line 14, delete "PICS" and insert -- PICs --.

Column 11, Line 17, after "principle," insert -- to --.

Column 14, Line 50, before "Firstly," delete "s".

Column 15, Line 36, before "board" delete "is".

Column 17, Line 63, delete "(399)." and insert -- (399), --.

In the Claims

Column 18, Line 56, Claim 2, after "position" insert -- of --.

Column 20, Line 61, Claim 25, before "further" delete "comprises".

Signed and Sealed this
Fourth Day of June, 2024

Katherine Kelly Vidal
*Director of the United States Patent and Trademark Office*